United States Patent
Tominaga

(10) Patent No.: US 9,984,745 B2
(45) Date of Patent: May 29, 2018

(54) SPIN ELECTRONIC MEMORY, INFORMATION RECORDING METHOD AND INFORMATION REPRODUCING METHOD

(71) Applicant: NATIONAL INSTITUTE OF ADVANCED INDUSTRIAL SCIENCE AND TECHNOLOGY, Tokyo (JP)

(72) Inventor: Junji Tominaga, Ibaraki (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days. days.

(21) Appl. No.: 15/036,666

(22) PCT Filed: Sep. 19, 2014

(86) PCT No.: PCT/JP2014/074796
§ 371 (c)(1),
(2) Date: May 13, 2016

(87) PCT Pub. No.: WO2015/072228
PCT Pub. Date: May 21, 2015

(65) Prior Publication Data
US 2016/0284394 A1   Sep. 29, 2016

(30) Foreign Application Priority Data
Nov. 15, 2013   (JP) .................................. 2013-236847

(51) Int. Cl.
*H01L 43/08* (2006.01)
*G11C 11/56* (2006.01)
(Continued)

(52) U.S. Cl.
CPC ........ *G11C 11/5607* (2013.01); *G06F 3/0625* (2013.01); *G06F 3/0659* (2013.01);
(Continued)

(58) Field of Classification Search
CPC ......... H01L 43/02; H01L 43/08; H01L 43/10; G11C 11/14–11/16; G11C 11/161
See application file for complete search history.

(56) References Cited

U.S. PATENT DOCUMENTS 9,019,777 B2 * 4/2015 Nakai ..................... G11C 11/16
  365/158
9,281,040 B2 * 3/2016 Soree ...................... H01L 43/02
(Continued)

FOREIGN PATENT DOCUMENTS

JP   2008-047566 A   2/2008
JP   4621897 B2   11/2010
(Continued)

OTHER PUBLICATIONS

Notice of Reasons for Rejection mailed by the Japanese Patent Office dated Nov. 22, 2016, for corresponding Japanese Patent Application No. JP 2015-547678. (With English Translation).
(Continued)

*Primary Examiner* — Allison P Bernstein
(74) *Attorney, Agent, or Firm* — Pergament & Cepeda LLP; Milagros A. Cepeda; Edward D. Pergament

(57) ABSTRACT

A spin electronic memory of the present invention includes: a pair of electrodes 1, 2, recording layers 6a, 6b, and 6c between the electrodes 1 and 2, the recording layer being formed by laminating first alloy layer 5 and second alloy layer 4, the first alloy layer 5 being formed to contain any one of SbTe, $Sb_2Te_3$, BiTe, $Bi_2Te_3$, BiSe, and $Bi_2Se_3$ as a principal component and to have a thickness of 2 nm to 10 nm, the second alloy layer 4 being formed to contain an alloy
(Continued)

expressed by general formula (1) as a principal component; and spin injection layer 7 formed with a magnetic material to inject a spin into the recording layer with the magnetic material being magnetized, $$M_{1-x}Te_x \quad (1)$$

where M represents an atom selected from atoms of Ge, Al, and Si, and x represents a value of 0.5 or more and less than 1.

14 Claims, 7 Drawing Sheets

(51) Int. Cl.
| | |
|---|---|
| G11C 11/16 | (2006.01) |
| G11C 11/18 | (2006.01) |
| G11C 13/04 | (2006.01) |
| H01L 43/10 | (2006.01) |
| H01L 45/00 | (2006.01) |
| G06F 3/06 | (2006.01) |
| G11C 13/00 | (2006.01) |
| H01L 43/02 | (2006.01) |

(52) U.S. Cl.
CPC .......... *G06F 3/0688* (2013.01); *G11C 11/161* (2013.01); *G11C 11/1673* (2013.01); *G11C 11/1675* (2013.01); *G11C 11/18* (2013.01); *G11C 13/0004* (2013.01); *G11C 13/04* (2013.01); *H01L 43/02* (2013.01); *H01L 43/08* (2013.01); *H01L 43/10* (2013.01); *H01L 45/065* (2013.01); *H01L 45/1233* (2013.01); *H01L 45/144* (2013.01)

(56) References Cited

U.S. PATENT DOCUMENTS

| | | |
|---|---|---|
| 2010/0200828 A1 | 8/2010 | Tominaga et al. |
| 2011/0207284 A1 | 8/2011 | Tominaga et al. |

FOREIGN PATENT DOCUMENTS

| | | |
|---|---|---|
| JP | 4635236 B2 | 2/2011 |
| JP | 2011-138924 A | 7/2011 |
| JP | 2013-051245 A | 3/2013 |
| WO | 2013/125101 A1 | 8/2013 |

OTHER PUBLICATIONS

Zhang et al., "Topological insulators in Bi2Se3, Bi2Te3 and Sb2Te3 with a single Dirac cone on the surface", Nature Physics, Jun. 2009, pp. 438 to 442, vol. 5, Macmillan Publishers Limited.

Xia et al., "Observation of a large-gap topological-insulator class with a single Dirac cone on the surface", Nature Physics, Jun. 2009, pp. 398 to 402, vol. 5, Macmillan Publishers Limited.

Simpson et al., "Interfacial phase-change memory", Nature Nanotechnology, Jul. 3, 2011, pp. 1 to 5, Macmillan Publishers Limited.

Tominaga et al., "Electrical-field induced giant magnetoresistivity in (non-magnetic) phase change films", Applied Physics Letters, 2011, pp. 152105-1 to 152105-3, vol. 99, American Institute of Physics.

Tominaga et al., "Topological insulating and spin-properties emerged in GeTe/Sb2Te3 superlatticed phase change memory", Abstracts of the Meeting of the Physical Society of Japan, Aug. 26, 2013, p. 603, vol. 68—issue No. 2, Part 4. (With English Translation).

International Search Report dated Dec. 9, 2014, for corresponding International Patent Application No. PCT/JP2014/074796. (With English Translation).

Written Opinion dated Dec. 9, 2014, for corresponding International Patent Application No. PCT/JP2014/074796. (With English Translation).

International Preliminary Report on Patentability dated May 17, 2016, for corresponding International Patent Application No. PCT/JP2014/074796.

\* cited by examiner

SPIN ELECTRONIC MEMORY, INFORMATION RECORDING METHOD AND INFORMATION REPRODUCING METHOD

This application is a National Phase application under 35 U.S.C. 371 of International Application No. PCT/JP2014/074796, filed on Sep. 19, 2014, which claims priority to Japanese provisional application No. 2013-236847, filed on Nov. 15, 2013, all of which are hereby incorporated by references in their entireties.

TECHNICAL FIELD

The present invention relates to a spin electronic memory capable of performing memory operation of multi-valued information using an electron spin, and an information recording method and an information reproducing method using the spin electronic memory.

BACKGROUND ART

Computers, which support contemporary civilization, operate with current which is a flow of electrons. Devices applied to recording and deletion of information by operation of the current are formed with a semiconductor. Electrons passing through the semiconductor generate Joule heat when they are scattered by impurities or Coulomb force.

Accordingly, a cooling fan is necessary for the computers. The Joule heat causes energy loss since it disables part of input energy from being used for recording and deletion of information. Therefore, there is no doubt that suppressing the electron scattering is a main challenge in technical development for power-saving electronic devices.

As one of the approaches to the challenge, there is conventionally a method for suppressing the electron scattering by operating the electronic devices at cryogenic temperature. For example, use of a superconductor corresponds to the method. Since electron scattering becomes zero in the superconductor, there is no electric resistance nor generation of Joule heat. Therefore, the electron scattering does not occur.

However, it should be noted that the method requires cooling of the electronic devices to the temperature of several kelvins, and execution of this process requires energy. It is also difficult to generalize and commercialize the electronic devices using such a cryogenic temperature state. Accordingly, there is still no sufficient means that can suppress the electron scattering at room temperature.

However, this situation has been changing from around 2007. The change is triggered by a theoretical model of a topological insulator proposed as a theory of physics. The topological insulator, which is an insulator using a special electronic state generated on an object surface or in an interface between the objects, is explained based on the relativistic effect generated when an inner-shell electron of an element having a relatively large atomic number moves at a rate close to the velocity of light.

That is, due to the function (spin-orbit interaction) of this electron, a spin-orbit interaction term is added to a Hamiltonian having a band structure formed by the electron. As a result, a change occurs in the band structure and in an energy eigenvalue. In this case, a certain special substance may have a special band structure in which an uppermost band in the valence band and a lowermost band in the conduction band are bonded on a vacuum surface, while an empty band remains in the inside of the substance.

This results in appearance of an unknown special physical property characterized by formation of a conductor on the surface of the substance or the interface thereof and formation of an insulator in the inside of the substance due to the presence of the band. A substance with such characteristics is called a "topological insulator" (see H. Zhang et al. Nature Physics, 5, 438 (2009)).

The special electronic band structure of the topological insulator has strange characteristics that electrons present on the surface of the substance or the interface thereof are divided into two electron spin currents having different spins due to time-reversal symmetry, and these currents continue to flow without application of voltage. This signifies, in other words, that the topological insulator has an important property of being resistant to the electron scattering caused by the impurities and the like. This characteristic is very strongly preserved if, for example, there is no external magnetic field that compromises the time-reversal symmetry. The name of the topological insulator is originated from the fact that the characteristics of such an electronic band structure are similar to the properties of the topological polyhedron theory in mathematics (see H. Zhang et al. Nature Physics, 5, 438 (2009)).

Since the presence of the topological insulator was theoretically predicted, search for materials having this strange property had started. As a result, materials such as bismuth-tellurium alloys and antimony-tellurium alloys having high crystallinity have been confirmed by experiments performed with photoelectron spectroscopy. However, since single crystals used for these experiments were fabricated by such a method involving cooling of fusion alloys, it is difficult to immediately apply the materials to electronic devices (see Y. Xia et al. Nature Physics, 5, 398 (2009)).

Meanwhile, for reduction in power consumption in phase-change solid-state memories, which do not have any relation to the topological insulator, the inventors of the present invention have proposed a superlattice phase-change solid-state memory including a superlattice phase-change film which is formed from a laminate of a crystal alloy layer made of germanium tellurium and a crystal alloy layer made of antimony tellurium, the layers being laminated such that (111) surface axes of the respective crystal alloy layers are aligned with a c-axis. In this memory, an arraying structure of germanium atoms are switched in a crystal growth axial direction to enable memory operation to be executed (see Japanese Patent No. 4621897, Japanese Patent No. 4635236 and J. Tominaga et al. Nature Nanotechnology, 6, 501 (2011)).

The inventors of the present invention noticed that the superlattice phase-change solid-state memory can be an ideal topological insulator. This is based on the following reason. That is, while a crystal alloy layer ($Sb_2Te_3$ crystal alloy layer) having an atomic ratio of antimony and tellurium being 2:3 is defined as the topological insulator as disclosed in H. Zhang et al. Nature Physics, 5, 438 (2009), a structure including the plurality of crystal alloy layers isolated by a crystal alloy layer (GeTe crystal alloy layer) having an atomic ratio of germanium and tellurium being 1:1 and having a band gap is just used as a recording layer of the superlattice phase-change solid-state memory proposed by the inventors of the present invention. Of course, it should be confirmed whether the crystal alloy layer made of germanium and tellurium has the same function as a vacuum band. Accordingly, a simulation was performed based on ab initio calculation using the quantum theory, which confirmed that the crystal alloy layer plays the role equivalent to that of the vacuum band (see International Publication No. WO2013/125101).

According to the simulation, at a certain point (gamma point) in reciprocal space, a lowermost band in the conduction band and an uppermost band in the valence band cross each other in the vicinity of the fermi band so as to be in point contact with each other. This phenomenon is a specific characteristic of the topological insulator, and the gamma point precisely corresponds to a centrosymmetric point of the GeTe crystal alloy layer. That is, this layer serves as a nonscattering layer of the electrons, so that the electrons can freely move in two dimensions in this layer (see International Publication No. WO2013/125101).

As a result of advancing the ab initio calculation with the number of blocks (one block is about 1 nm) of the $Sb_2Te_3$ crystal alloy layer being varied, the inventors of the present invention found out that band crossing which is a characteristic of the topological insulator is exhibited when the number of blocks of the $Sb_2Te_3$ crystal alloy layer is not one but at least two or more.

It was also found out that layers thinner than 2 blocks do not turn into topological insulators but instead, their band degeneracy is lifted at a gamma point in reciprocal space and they exhibit what is called a Rashba effect of splitting into two spin bands having different energy states.

The Rashba effect exhibited by the superlattice phase-change film is significantly larger than the effect exhibited by any other known materials. A difference between these spin bands reaches as high as 200 meV in the simulation based on the ab initio calculation. The value is so large that the difference in spin characteristics can be observed even at room temperature (see J. Tominaga et al. Applied Physics Letter, 99, 152105 (2011)).

The superlattice phase-change film was also formed on a silicon wafer with a thickness of the $Sb_2Te_3$ crystal alloy layer being varied, and an external magnetic field was applied in a direction perpendicular to the surface of the layer to vary the density of split spin electrons. This state was measured as a change in reflectance by making circularly polarized light incident thereon. The result indicated that when the $Sb_2Te_3$ crystal alloy layer is thinner than 2 nm, the Rashba effect is notable, whereas when the $Sb_2Te_3$ crystal alloy layer is 2 nm or more, a difference in reflectance caused by spin splitting is small. To put it another way, it can be concluded that the superlattice phase-change film, in which the $Sb_2Te_3$ crystal alloy layer has the thickness of 2 nm or more, has a small Rashba effect and turns into the topological insulator.

That is, a laminated film made up of the GeTe crystal alloy layer and the $Sb_2Te_3$ crystal alloy layer thinner than 2 nm serves as a spin current generation layer having the Rashba effect, whereas a laminated film made up of the GeTe crystal alloy layer and the $Sb_2Te_3$ crystal alloy layer having a thickness of 2 nm or more can serve as a spin current accumulation layer which can accumulate a spin current. If these two kinds of crystal alloy layers are laminated and an electric field is applied, for example, in a perpendicular direction for electron injection, it becomes possible to provide a spin electronic memory capable of performing not only spin control but also spin accumulation (see International Publication No. WO2013/125101).

However, when spin accumulation is performed in the spin electronic memory with the technique involving the topological insulator, recording and reproduction of multi-valued information cannot be performed since only two states: a spin liberated state; and a spin accumulated state, can be used. Accordingly, development of a spin electronic memory having a larger memory capacity is being expected.

SUMMARY OF INVENTION

Technical Problem

The present invention aims at solving the conventional problems to accomplish the following object. That is, the object of the present invention is to provide a spin electronic memory capable of recording multi-valued information and achieving considerable increase in memory capacity, and an information recording method and an information reproducing method using the spin electronic memory.

Solution to Problem

The solutions to the problems are as described below.

In one aspect, the present invention provides a spin electronic memory including: a pair of electrodes; a recording layer disposed between the electrodes, the recording layer being formed by laminating a first alloy layer and a second alloy layer, the first alloy layer being formed to contain any one of SbTe, $Sb_2Te_3$, BiTe, $Bi_2Te_3$, BiSe, and $Bi_2Se_3$ as a principal component and to have a thickness of 2 nm to 10 nm, the second alloy layer being formed to contain an alloy expressed by a following general formula (1) as a principal component; and a spin injection layer formed with a magnetic material and configured to inject a spin into the recording layer with the magnetic material being magnetized, $$M_{1-x}Te_x \quad (1)$$

where M represents an atom selected from atoms of Ge, Al, and Si, and x represents a value of 0.5 or more and less than 1.

In one variant, the present invention provides the spin electronic memory according to the present invention, wherein at least two or more of the recording layer are laminated and disposed.

In one variant, the present invention provides the spin electronic memory according to the present invention, wherein the first alloy layer has a hexagonal crystal structure, and the second alloy layer has a cubic crystal structure, and a c-axis of the first alloy layer is oriented in a laminating direction, and a (111) plane of the second alloy layer is oriented along an adjacent surface adjacent to the first alloy layer.

In one variant, the present invention provides the spin electronic memory according to the present invention, wherein the second alloy layer is formed to contain GeTe as a principal component.

In one variant, the present invention provides the spin electronic memory according to any one of the present invention, wherein the second alloy layer has a thickness of more than 0 and 4 nm or less.

In one variant, the present invention provides the spin electronic memory according to any one of the present invention, further including an orientation layer disposed as a base of the second alloy layer to orient a lamination plane of the second alloy layer laminated thereon along the (111) plane.

In another variant, the present invention provides the spin electronic memory according to the present invention, wherein the orientation layer has a composition and a crystal structure identical to those of the first alloy layer.

In another variant, the present invention provides the spin electronic memory according to the present invention, further including a magnetic section configured to form a magnetic field in a direction perpendicular to the plane of the spin injection layer to inject a spin into the recording layer through the spin injection layer.

In another aspect, the present invention provides a method for recording information using the spin electronic memory according to the present invention, the method including applying voltage having voltage values staged into n stages to n recording layers laminated, the voltage values being necessary for accumulating a spin in a saturated state in each of the recording layers, where n is an integer of at least 1 or more.

In yet another aspect, the present invention provides a method for reproducing information using the spin electronic memory according to the present invention, the method including measuring a status value of one of a resistance value and an optical reflectance of n recording layers laminated, and determining, based on the status value, number of the recording layers having information recorded thereon in the recording layers laminated, where n is an integer of at least 1 or more.

Advantageous Effects of Invention

According to the present invention, it becomes possible to provide a spin electronic memory capable of solving the problems in the conventional technology, recording multi-valued information, and achieving considerable increase in memory capacity, and an information recording method and an information reproducing method using the spin electronic memory.

DESCRIPTION OF EMBODIMENTS

Spin Electronic Memory

Figure 1A:
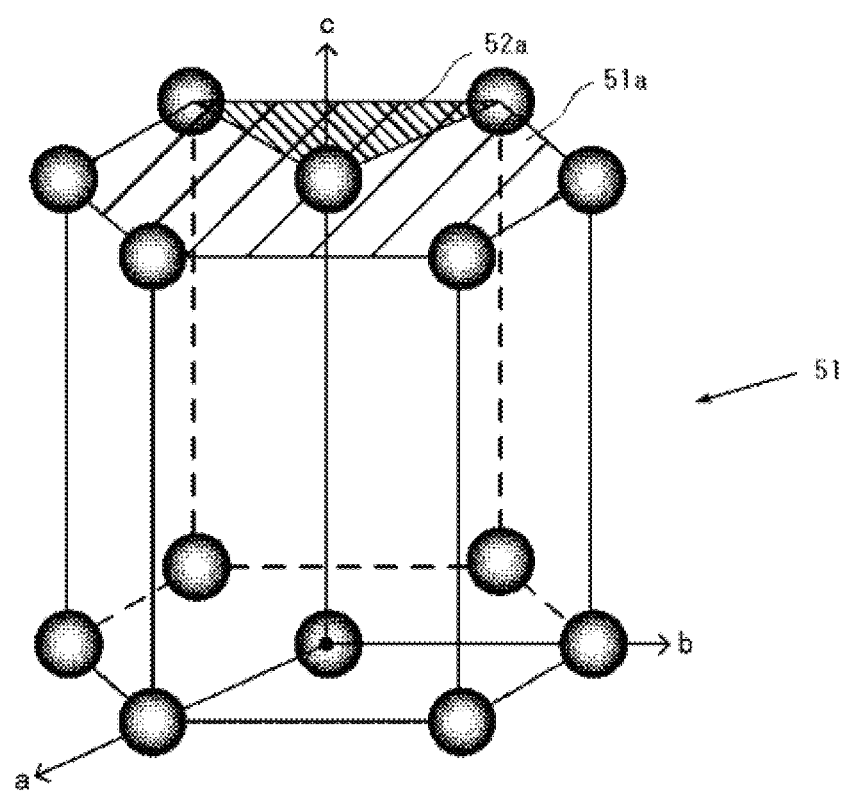
FIG. 1A is an explanatory view illustrating the crystal structure of a hexagonal first alloy layer and an orientation layer.

A spin electronic memory of the present invention includes a pair of electrodes, a recording layer, and a spin injection layer, and also includes members, such as an orientation layer and a magnetic section, as necessary.

<Recording Layer>

The recording layer is disposed between the pair of electrodes, the recording layer being formed by laminating a first alloy layer and a second alloy layer. Each of the recording layers can accumulate a spin, so that the spin electronic memory can record and reproduce multi-valued information depending on the number of lamination of the recording layers.

Therefore, while one recording layer may be sufficient, laminating at least two or more layers enables binary or more multi-valued information to be recorded.

The first alloy layer is formed to contain any one of SbTe, $Sb_2Te_3$, BiTe, $Bi_2Te_3$, BiSe, and $Bi_2Se_3$ as a principal component and to have a thickness of 2 nm to 10 nm.

The first alloy layer formed in this way functions as the topological insulator, which enables the spin injected from the spin injection layer to exist on a surface or an interface thereof.

In this specification, the term "principal component" refers to an element that forms a basic unit cell of a layer.

The first alloy layer is not particularly limited, but preferably has a hexagonal crystal structure with its c-axis being oriented in a laminating direction.

If the first alloy layer has such a crystal structure, a next layer laminated thereon serves as a template that provides orientation with use of the first alloy layer as a base, which makes it easy to provide the superlattice structure of these laminated body.

A method for forming the first alloy layer is not particularly limited. However, since the c-axis-oriented crystal structure can easily be provided, methods such as a sputtering method, a molecular beam epitaxy method, an atomic layer deposition (ALD) method, and a chemical vapor deposition (CVD) method are preferable.

The second alloy layer is formed with an alloy expressed by the following general formula (1) as a principal component.

The second alloy layer can be phase-changed into a first crystal phase, which is structured to have space inversion symmetry with respect to the center of the layer, and a second crystal phase, in which the space inversion symmetry is violated, depending on arrangement of M. In the second crystal phase, the second alloy layer has magnetic characteristics of a ferromagnetic material so that the spin can be accumulated.

Upon application of a relatively weak voltage, the second alloy layer can be phase-changed from the first crystal phase to the second crystal phase. Upon application of a relatively strong voltage, the second alloy layer can be phase-changed into the first crystal phase without the magnetic characteristics. By utilizing this characteristics, memory operation can be achieved, in which the second crystal phase where the spin can be accumulated is used as a set state, and the first crystal phase where the spin is liberated is used as a reset state.

$$M_{1-x}Te_x \quad (1)$$

where M represents an atom selected from atoms of Ge, Al, and Si, and x represents a value of 0.5 or more and less than 1.

Among the alloys expressed by the general formula (1), GeTe is preferable in particular as it has a large dielectric constant.

The thickness of the second alloy layer is not particularly limited but is preferably more than 0 and 4 nm or less.

When the thickness is more than 4 nm, the second alloy may exhibit independent and peculiar characteristics, which affect the characteristics of the recording layer that is a laminated structure body of the first alloy layer and the second alloy layer.

The second alloy layer is not particularly limited, but it is preferable that the second alloy layer has a cubic crystal structure and its (111) plane is disposed on an adjacent surface adjacent to the first alloy layer. It is more preferable that the second alloy layer has a centroid cubic crystal structure, and its (111) plane is disposed on the adjacent surface adjacent to the first alloy layer.

If the second alloy layer has such a crystal structure, a next layer laminated thereon serves as a template that provides orientation with use of the second alloy layer as a base. This makes it easy to provide the superlattice structure of these laminated bodies.

A method for forming the second alloy layer is not particularly limited. However, since the c-axis-oriented crystal structure can easily be provided, the methods such as the spattering method, the molecular beam epitaxy method, the ALD method, and the CVD method are preferable.

<Spin Injection Layer>

The spin injection layer, which is formed with a magnetic material, is structured as a layer configured to inject the spin into the recording layer while the magnetic material is magnetized. Note that the spin refers to a spin polarized electron. The spin injection layer has the role of applying voltage in a magnetized state so as to polarize the spin characteristics of electrons, which are conducted to the recording layer, with the magnetic material.

The magnetic material is not particularly limited. Examples of the magnetic material include magnetic layer formation materials used for known magnetic memories. Specific examples include TbFeCo, FeCo, MnCr, and MnPt. These materials are ferromagnetic materials, which can be utilized for the purpose of forming a magnetic field that orients the spin in a direction perpendicular to the plane of the spin injection layer serving as a magnetic layer and thereby conducting the spin to the recording layer disposed in parallel to the spin injection layer in the state where the spin orientations are aligned.

The thickness of the spin injection layer is not particularly limited, but is preferably 1 nm to 10 nm.

If the thickness is less than 1 nm, sufficient spin orientation may not be obtained, whereas if the thickness is more than 10 nm, magnetization may be too strong for smooth data deletion.

A method for forming the spin injection layer is not particularly limited. Examples of the method include the spattering process, the molecular beam epitaxy method, the ALD method, and the CVD method.

The spin injection layer may be disposed on the side, where an electrode for feeding electrons to the recording layer is disposed, with respect to the recording layer, so as to inject the spin to the recording layer.

<Electrode>

The electrode is not particularly limited and may properly be selected according to purposes. Electrodes used for known semiconductor elements may be disposed and formed by known methods.

<Orientation Layer>

When the spin electronic memory has a superlattice structure in which the crystal structure of the first alloy layer is oriented along the c-axis, and the (111) plane of the crystal structure of the second alloy layer is oriented along an adjacent surface adjacent to the first alloy layer, it becomes easy to obtain the topological insulator and the phase change characteristic.

The base of the first alloy layer is not particularly limited as the first alloy layer is easily obtained as a c-axis oriented object, whereas the second alloy layer needs to be laminated on the c-axis oriented object as a base so as to smoothly obtain the superlattice structure. Accordingly, when the second alloy layer is formed without use of the first alloy layer as a base, it is preferable to provide the orientation layer which is disposed as a base of the recording layer (the second alloy layer) so that a lamination surface of the second alloy layer in the recording layer, which is to be laminated on the orientation layer, is oriented along the (111) plane.

The orientation layer is not particularly limited as long as such a role is fulfilled. However, from a viewpoint of simplifying the manufacturing process, the orientation layer preferably has the composition and the crystal structure identical to those of the first alloy layer. That is, the orientation layer is preferable a crystal alloy layer, which is formed to contain any one of $SbTe$, $Sb_2Te_3$, $BiTe$, $Bi_2Te_3$, $BiSe$, and $Bi_2Se_3$ as a principal component, and which has a hexagonal crystal structure with its crystal orientation being oriented along the c-axis.

The thickness of the orientation layer is preferably 3 nm or more, and is more preferably 5 nm or more. When the thickness is less than 3 nm, the intensity of orientation in the c-axis direction may not sufficiently be obtained depending on formation methods.

From such a viewpoint, it is more preferable to manufacture the spin electronic memory not by laminating the second alloy layer with the first alloy layer as a base but by laminating the second alloy layer with the orientation layer as a base so as to stabilize the crystal structure of these layers.

Figure 1B:
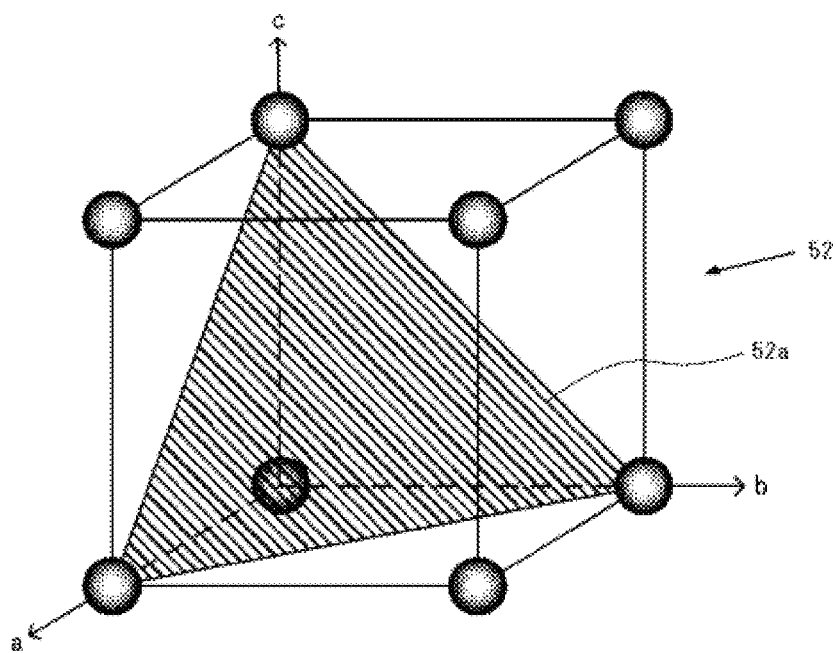
FIG. 1B is an explanatory view illustrating the crystal structure of a cubic second alloy layer.

Here, the laminated states of the first alloy layer, the second alloy layer, and the orientation layer will be described with reference to FIG. 1A and FIG. 1B. FIG. 1A is an explanatory view illustrating the crystal structure of the first alloy layer and orientation layer made of hexagonal crystal. FIG. 1B is an explanatory view illustrating the crystal structure of the second alloy layer made of cubical crystal.

When a crystal alloy layer 51 that is a hexagonal crystal is oriented along the c-axis as the first alloy layer and the orientation layer as illustrated in FIG. 1A, an adjacent surface 51a becomes hexagonal. Accordingly, when a crystal alloy layer 52 that is a cubical crystal is deposited on a surface of the crystal alloy layer 51 as the second alloy layer, a (111) plane illustrated in FIG. 1B becomes an adjacent surface 52a. That is, since the (111) plane of the cubical crystal is triangle, it matches with the adjacent surface 52a of the c-axis oriented crystal alloy layer 51. Accordingly, when the crystal alloy layer 52 that is a cubical crystal is deposited on the surface of the c-axis oriented crystal alloy layer 51, the adjacent surface 52a thereof can be used as the (111) plane of the crystal alloy layer 52. Contrary to this, when the crystal alloy layer 52 is formed without the crystal alloy layer 51, the crystal alloy layer 52 is oriented along, for example, a plane (100), as a result of which lattice disorder tends to occur in the superlattice structure formed by the laminated body of these layers.

<Magnetic Section>

From a viewpoint of injecting the spin into the recording layer, in the spin electronic memory, a magnetic field perpendicular to the surface of the spin injection layer is applied after the spin injection layer is formed, so that the spin injection layer is magnetized and is provided with the role of aligning the orientation of the spin. The magnetic section may be disposed in the spin electronic memory, or may be removed after the spin injection layer is formed and the magnetized state is fixed.

In the former case, from the viewpoint of further reinforcing the strength of the magnetic field formed by the spin injection layer, the magnetic section may be disposed as a layer laminated in parallel to the spin injection layer so as to assist the magnetized spin injection layer to inject the spin into the recording layer. In this case, the magnetic section is constituted as a magnetic layer which forms the magnetic field perpendicular to the surface of the spin injection layer and injects the spin into the recording layer through the spin injection layer.

In the latter case, the spin is injected into the recording layer by the magnetic field formed by the spin injection layer fixed in the magnetized state.

The magnetic section is not particularly limited and may be constituted with known permanent magnets, electromagnets, or the like.

Note that the spin electronic memory may include other members, other than the orientation layer and the magnetic section, as necessary. These other members are not particularly limited as long as the effect of the present invention is not compromised. Examples of the members include known semiconductor memories.

By integrating a plurality of spin electronic memories, a spin electronic circuit may be constituted. The circuit configuration of the spin electronic circuit is not particularly limited and may properly be selected depending on purposes. The circuit configuration may be obtained by using known semiconductor circuits.

Figure 2:
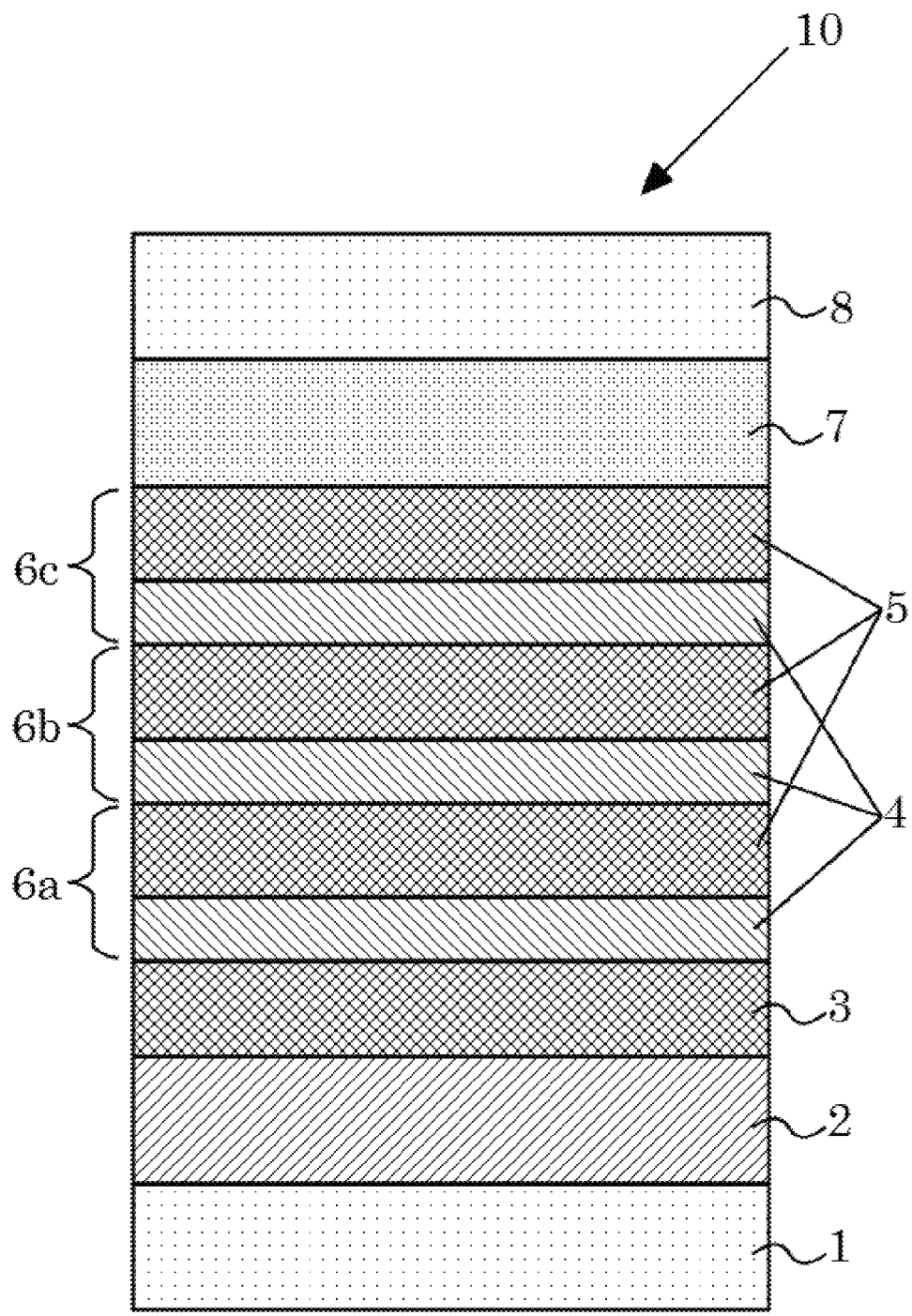
FIG. 2 is a cross sectional view illustrating the layer configuration of a spin electronic memory according to one embodiment of the present invention.

As a configuration example of the spin electronic memory, a spin electronic memory 10 according to one embodiment of the present invention will be described with reference to FIG. 2. FIG. 2 is a cross sectional view illustrating the layer configuration of the spin electronic memory according to the one embodiment of the present invention.

The spin electronic memory 10 is configured to include a semiconductor substrate 2, an orientation layer 3, three recording layers 6a to 6c, a spin injection layer 7, and a layered upper electrode 8 disposed in this order on a layered lower electrode 1.

Each of the three recording layers 6a to 6c is structured by laminating a first alloy layer 5 on a second alloy layer 4.

The configuration of the spin electronic memory 10 is merely an example. The lower electrode 1 may be disposed on the semiconductor substrate 2, or the orientation layer 3 may directly be disposed on the lower electrode 1 without using the semiconductor substrate 2. The spin injection layer 7 may be disposed on the side of the upper electrode 8, which feeds an electron flow to the recording layers 6a to 6c, with respect to the recording layers 6a to 6c. The spin injection layer 7 may be disposed on the upper electrode 8 by exchanging the laminating order between the spin injection layer 7 and the upper electrode 8.

Now, the function of the spin electronic memory will be described by using the spin electronic memory 10 as an example.

The first alloy layer 5 of the recording layers 6a to 6c functions as the topological insulator, which conducts the spin to the second alloy layer 4. The second alloy layer 4 includes a first crystal phase structured to have the space inversion symmetry with respect to the center of the layer, and a second crystal phase in which the space inversion symmetry is violated, the layers being formed by arrangement of germanium atoms, aluminum atoms, or silicon atoms. The inventors of the present invention found out that the second crystal phase exhibits the Rashba effect and magnetic characteristics, and functions as a ferromagnetic material which can hold the spin. It was also confirmed that the second crystal phase is preferentially developed by application of relatively weak voltage. The specific value of the voltage can be confirmed by measuring the characteristics in advance.

Now, a relatively weak voltage is applied to obtain a state (set state) in which the second crystal phase is preferentially developed in the second alloy layer 4 in a mixed phase, and voltage is applied to the spin electronic memory 10 from an external power supply. Consequently, depending on the value of the voltage, spin-polarized electrons are fed to the recording layers 6a to 6c by the spin injection layer 7, so that the spin can be accumulated in the recording layers 6a to 6c. The spin is held by the first alloy layer 5 functioning as the topological insulator and the second alloy layer 4 in the set state.

In this case, accumulation of the spin in the recording layers 6a to 6c is started in order from the recording layer 6a closest to the electrode side into which electrons are fed. Once the spin accumulated in the recording layer 6a is saturated, the spin is accumulated in the second closest recording layer 6b, and then finally in the recording layer 6c.

Figure 3A:
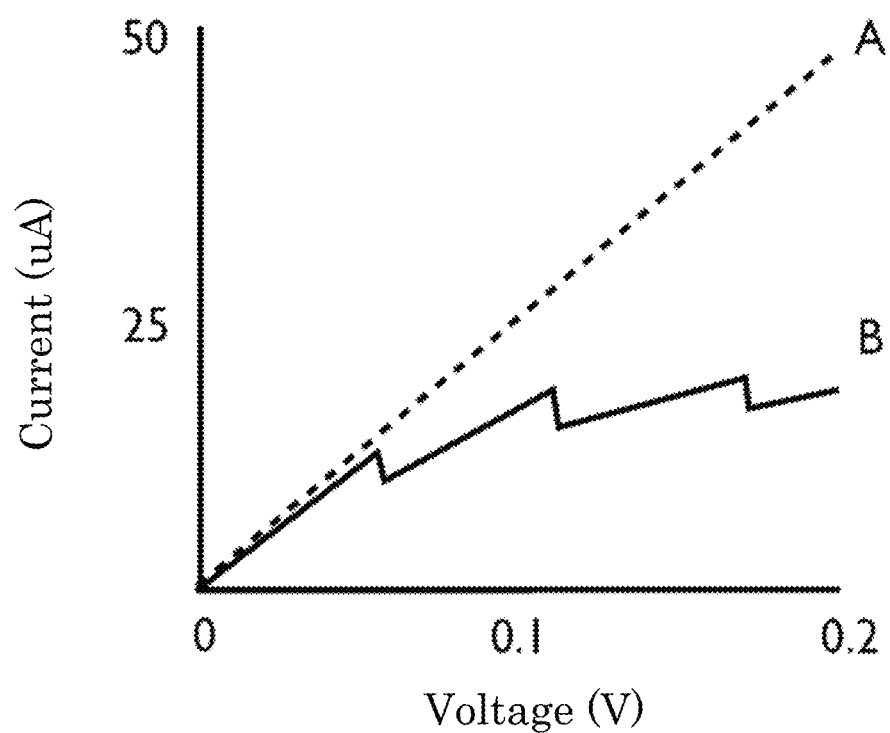
FIG. 3A is an explanatory view illustrating a current-voltage characteristic of the spin electronic memory according to one embodiment of the present invention.
Figure 3B:
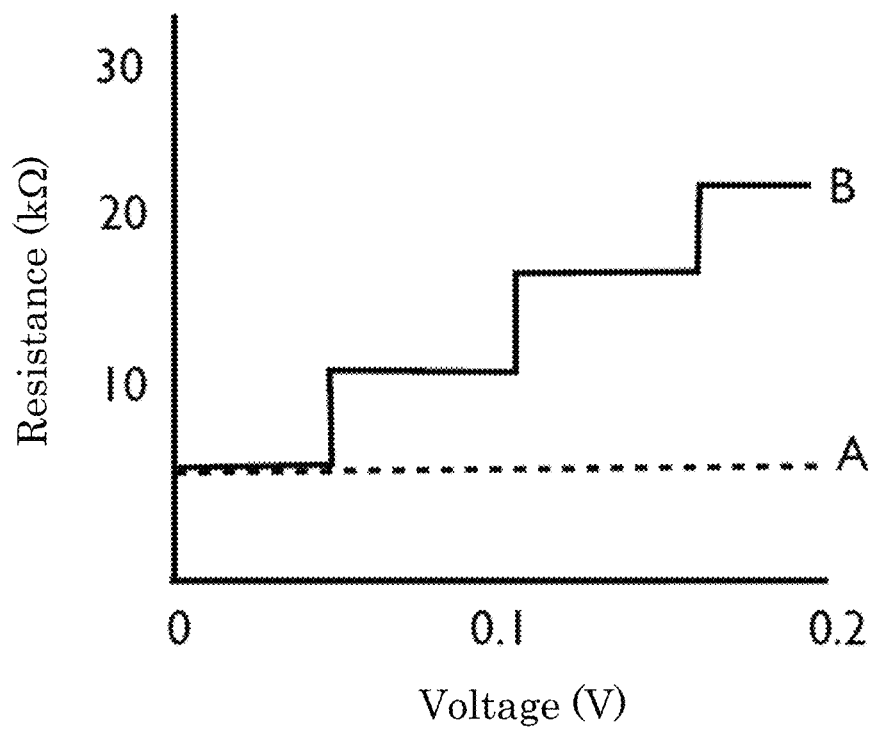
FIG. 3B is an explanatory view illustrating a resistance-voltage characteristic of the spin electronic memory according to one embodiment of the present invention.

This process will be described with reference to FIG. 3A and FIG. 3B. FIG. 3A is an explanatory view illustrating a current-voltage characteristic of the spin electronic memory according to one embodiment of the present invention. FIG. 3B is an explanatory view illustrating a resistance-voltage characteristic of the spin electronic memory according to one embodiment of the present invention. In the drawings, a reference sign A expresses a characteristic when the magnetic field is not applied, and a reference sign B expresses a characteristic when the magnetic field is applied.

As illustrated in FIG. 3A, in the case of the characteristic expressed by the reference sign A, a current value increases in proportion to a voltage value, but in the case of the characteristic of the reference sign B, the current value gradually decreases as the voltage value increases. That is, when the magnetic field is applied in a laminating direction of the recording layers 6a to 6c while the spin injection layer 7 is magnetized with an electromagnet, the current value gradually decreases in response to gradual accumulation of the spin in the recording layers 6a to 6c. As illustrated in FIG. 3B, in the case of the characteristic expressed by the reference sign A, the resistance value increases in proportion to the voltage value, but in the case of the characteristic expressed by the reference sign B, the resistance value gradually increases as the voltage value increases. That is, when a magnetic field is applied with an electromagnet, the resistance value gradually increases in response to gradual accumulation of the spin in the recording layers 6a to 6c.

In the spin electronic memory 10, a status value change phenomenon, such as gradual decrease in current value and increase in resistance value, is utilized to provide a specified application voltage value, so that the state of accumulation of the spin in the recording layers 6a to 6c is controlled to enable multi-valued information to be recorded and reproduced.

In this example, the memory is so configured that three recording layers are used to enable four-value information to be recorded and reproduced. However, a memory for multi-valued information larger than four-value may be implemented by increasing the number of the recording layers.

In the spin electronic memory 10, upon application of a relatively strong voltage, the second crystal phase of the second alloy layer 4 is phase-changed into the first crystal phase, so that magnetism is lost. As a result, the recorded information in the recording layers 6a to 6c based on the accumulation state of the spin can be deleted (reset state). The reset state can be returned to the set state again by applying a relatively weak voltage, so that the spin electronic memory 10 can repeatedly perform recording and deletion of information. The specific value of the voltage to provide the reset state can be confirmed by measuring the characteristic in advance.

(Information Recording Method)

An information recording method of the present invention is a method for recording information using the spin electronic memory, the method including applying voltage having voltage values staged into n stages to n recording layers laminated, the voltage values being necessary for accumulating a spin in a saturated state in each of the recording layers, where n is an integer of at least 1 or more.

As described with reference to FIG. 3A and FIG. 3B, in the spin electronic memory, the spin starts to be injected into the recording layer closest to the spin feeding side, and once the accumulated spin is saturated, the spin is accumulated in the second closest recording layer.

In this case, by measuring the current-voltage characteristic in advance, the voltage for accumulating the spin in each of the recording layers in a saturated state can be grasped as a voltage value in each of the stages corresponding to gradual decrease in the current value.

Accordingly, as a voltage value necessary for accumulating the spin in the saturated state in each of the recording layers, the voltage value in each stage is staged into n stages corresponding to the number of lamination of the recording layers, and the voltage having the staged voltage values is applied, so that the spin is selectively accumulated in the recording layers. This enables information corresponding to the number of the recording layers to be recorded.

When a relatively weak voltage is applied to the spin electronic memory before recording is performed, the memory is put in the set state where information can be recorded. When a relatively strong voltage is applied to the spin electronic memory after the recording is performed, the memory is put in the reset state where the recording is deleted. This enables recording to be repeated.

(Information Reproducing Method)

An information reproducing method of the present invention is a method for reproducing information using the spin electronic memory, the method including measuring a status value of one of a resistance value and an optical reflectance of n recording layers laminated, and determining, based on the status value, number of the recording layers having information recorded thereon in the recording layers laminated, where n is an integer of at least 1 or more.

The spin electronic memory enables information to be reproduced from the state of accumulation of the spin in the recording layers by the information recording method.

The state where information is recorded on the recording layer, i.e., the state of accumulation of the spin, can be determined based on the resistance value (see FIG. 3B) and the optical reflectance of the recording layer. That is, the voltage value used for the recording is measured in advance in association with the resistance value and the optical reflectance of the recording layer during the recording. Accordingly, based on the status value including the resistance value and the optical reflectance of the recording layer in the state where information was recorded, the voltage value corresponding to the status value and by extension, the number of layers having information recorded thereon are determined. As a result, the information based on the number of layers can be reproduced.

In the case where the resistance value is read as the status value, the voltage value applied to the spin electronic memory is made small enough to maintain the recording state of the recording layers at the time of readout, so that the resistance value is read out without affecting the state of accumulation of the spin in the first recording layer having a smallest recording level (recording layer closest to the spin injection layer).

EXAMPLES

First, a sputtering system (helicon sputtering system made by ULVAC, Inc.) was used to perform sputtering targeting Sb and Te (composition ratio of 2:3) on a Si substrate having a pure surface to laminate an orientation layer made of an $Sb_2Te_3$ crystal alloy layer with its c-axis crystal orientation being oriented in the laminating direction, the orientation layer being formed to a thickness of 5 nm.

Next, sputtering targeting Ge and Te (composition ratio of 1:1) was performed with the orientation layer as a base by using the sputtering system to laminate a second alloy layer made of a GeTe crystal alloy layer with a (111) plane of the crystal being oriented along an adjacent surface adjacent to the orientation layer, the second alloy layer being formed to a thickness of 1 nm.

Next, sputtering targeting Sb and Te (composition ratio of 2:3) was performed on the second alloy layer by using the sputtering system to laminate a first alloy layer made of an $Sb_2Te_3$ crystal alloy layer with its c-axis crystal orientation being oriented in the laminating direction, the first alloy layer being formed to a thickness of 5 nm.

The layer formed from a laminated structure of these first and second alloy layers was used as a recording layer, and seven recording layers were further formed to laminate total eight recording layers.

The orientation layer, the first alloy layer, and the second alloy layer were formed under the condition of vacuum and the sputtering temperature was 250° C. Analysis of the crystal structure of the orientation layer, the first alloy layer, and the second alloy layer was conducted by comparing the result of model-based ab initio calculation and the result of X diffraction and by taking and observing high-resolution transmission electron images of the cross sections in the end.

Next, sputtering targeting Te, Ge, and Co (composition ratio of 1:1:1) was performed on the top layer of the recording layers by using the sputtering system to laminate a magnetic layer made of a TeFeCo crystal alloy layer, the magnetic layer being formed to a thickness of 2 nm as a spin injection layer.

Next, sputtering targeting Ti and N (composition ratio of 1:1) was performed on the magnetic layer with the sputtering system to laminate a TiN layer as an upper electrode, the TiN layer being formed to a thickness of 40 nm. As in the case of the upper electrode, a TiN layer as a lower electrode was formed to a thickness of 40 nm on a surface opposite to the surface having the orientation layer of the Si substrate being laminated thereon.

Thus, the spin electronic memory according to the example was manufactured.

Figure 4A:
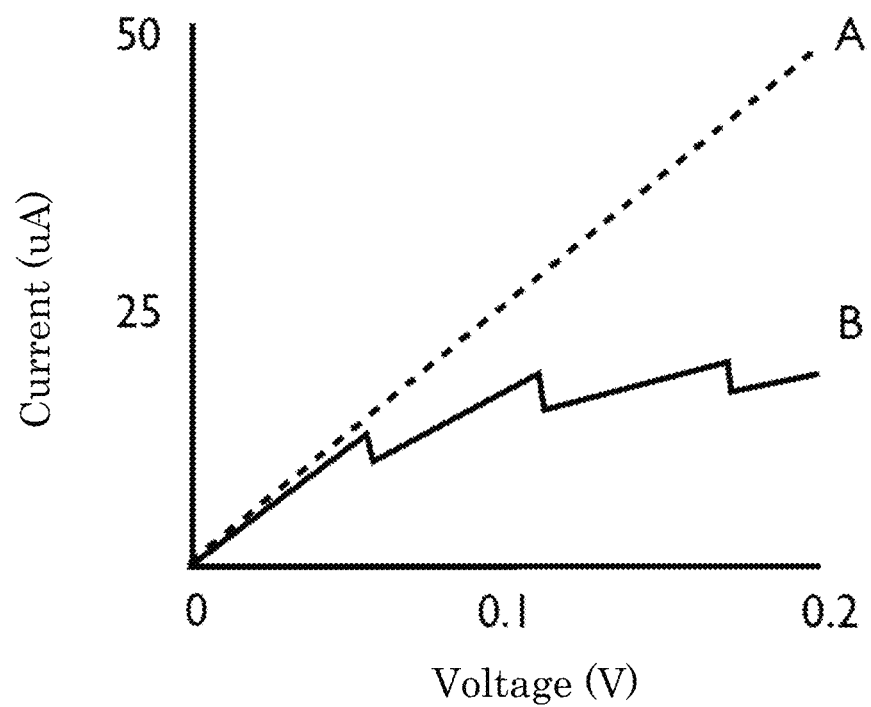
FIG. 4A is an explanatory view illustrating the current-voltage characteristic of the spin electronic memory according to an example of the present invention.

The spin electronic memory according to the first example was connected to an external power supply to apply voltage between the upper and lower electrodes. Moreover, the spin injection layer was magnetized with an electromagnet while a magnetic field of 0.4 T (tesla) was applied in the laminating direction of the recording layer. As the voltage value was gradually increased, the current passing through the memory was measured. The result of measurement of the current-voltage characteristic is illustrated in FIG. 4A. In the drawing, a reference sign A expresses a current-voltage characteristic when a magnetic field of 0.4 T is not applied, and a reference sign B expresses a current-voltage characteristic when the magnetic field of 0.4 T is applied.

As illustrated in FIG. 4A, it was confirmed that the current value increases in proportion to increase in the voltage value when the magnetic field of 0.4 T is not applied (reference sign A in the drawing), whereas when the magnetic field of 0.4 T is applied (reference sign B in the drawing), the current value gradually increases as the voltage value increases.

This indicates the following. First, the spin is soon accumulated in the second alloy layer of the recording layer closest to the magnetic layer configured to inject the spin. Once accumulation of the spin is saturated, the spin is accumulated in the second alloy layer second closest to the magnetic layer. The spin is gradually accumulated in order from the second alloy layer on the side closer to the magnetic layer. That is, a phenomenon of gradual and temporary decrease in the current value is observed whenever spin accumulation is saturated in the second alloy layer of one layer.

Figure 4B:
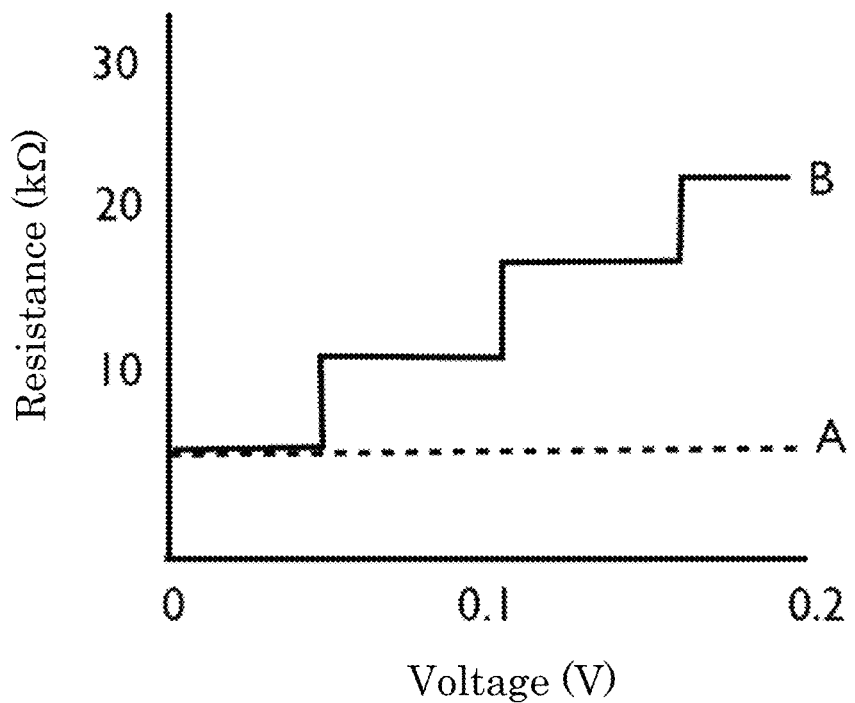
FIG. 4B is an explanatory view illustrating the resistance-voltage characteristic of the spin electronic memory according to an example of the present invention.

The result of measurement of the resistance-voltage characteristic in this case is illustrated in FIG. 4B. As in FIG. 4A, a reference sign A expresses a current-voltage characteristic when a magnetic field of 0.4 T is not applied, and a reference sign B expresses a current-voltage characteristic when the magnetic field of 0.4 T is applied.

As illustrated in FIG. 4B, it was confirmed that the resistance value increases in proportion to increase in the voltage value when the magnetic field of 0.4 T is not applied (reference sign A in the drawing), whereas when the magnetic field of 0.4 T is applied (reference sign B in the drawing), the resistance value gradually increases as the voltage value increases.

This indicates that the spin is gradually accumulated in the second alloy layer on the side closer to the magnetic layer as in FIG. 4A. A phenomenon of increase in the resistance value in response to gradual decrease in the current value is observed.

Therefore, when the voltage applied between the electrodes is made into a fixed value voltage, the number of the second alloy layers having the spin accumulated therein can be controlled, and the number of the layers can be read from the resistance value of the memory. This makes it possible to implement a memory for recording multi-values according to the number of layers of the second alloy layers having the spin accumulated therein and to enable the recorded multi-valued information to be reproduced.

Based on the above measurement, a relatively strong current pulse of 1.0 V was temporarily passed between the upper and lower electrodes for 100 ns in the spin electronic memory according to the first example, the spin electronic memory having multi-valued information recorded thereon. As a result, the memory lost the magnetism of the second alloy layer, and thereby the recorded state was reset.

Then, a relatively weak current pulse of 0.3 V was newly passed for 500 ns to recover the set state, in which the second alloy layer is phase-changed to gain magnetic characteristics.

Next, the spin electronic memory according to the first example that is in the set state was connected to an external power supply, and a voltage of 0.15 V was applied between the upper and lower electrodes. Moreover, a magnetic field of 0.4 T (tesla) was applied in the laminating direction of the recording layer by the electromagnet, and then application of the voltage was stopped.

In this state, the electromagnet was turned off to remove the magnetic field formed by the electromagnet, and a voltage of 0.02 V was applied again to measure the resistance value of the memory. As a result, a resistance value of 16 kΩ obtained upon application of the magnetic field at 0.15 V was measured again as in the case of the measurement of FIG. 4B.

Therefore, the spin electronic memory according to the first example can be used as a memory in which the set state and the reset state are repeated to enable multi-valued information to be repeatedly recorded and reproduced.

REFERENCE SIGNS LIST

1 Lower electrode
2 Semiconductor substrate
3 Orientation layer
4 Second alloy layer
5 First alloy layer
6a, 6b, 6c Recording layer
7 Spin injection layer
8 Upper electrode
10 Spin electronic memory

The invention claimed is:

1. A method for recording information using a spin electronic memory, the method comprising applying voltage having voltage values staged into n stages to n recording layers laminated, the voltage values being necessary for accumulating a spin in a saturated state in each of the recording layers, where n is an integer of at least 1 or more,
   wherein the spin electronic memory comprises:
   a pair of electrodes;
   a recording layer disposed between the electrodes, the recording layer being formed by laminating a first alloy layer and a second alloy layer, the first alloy layer being formed to contain any one of SbTe, $Sb_2Te_3$, BiTe, $Bi_2Te_3$, BiSe, and $Bi_2Se_3$ as a principal component and to have a thickness of 2 nm to 10 nm, the second alloy layer being formed to contain an alloy expressed by a following general formula (1) as a principal component; and
   a spin injection layer formed with a magnetic material and configured to inject a spin into the recording layer with the magnetic material being magnetized, $$M_{1-x}Te_x \qquad (1)$$

where M represents an atom selected from atoms of Ge, Al, and Si, and x represents a value of 0.5 or more and less than 1.

2. The method for recording information according to claim 1, wherein
   the first alloy layer has a hexagonal crystal structure, and the second alloy layer has a cubic crystal structure, and
   a c-axis of the first alloy layer is oriented in a laminating direction, and a (111) plane of the second alloy layer is oriented along an adjacent surface adjacent to the first alloy layer.

3. The method for recording information according to claim 1, wherein the second alloy layer is formed to contain GeTe as a principal component.

4. The method for recording information according to claim 1, wherein the second alloy layer has a thickness of more than 0 and 4 nm or less.

5. The method for recording information according to claim 1, further comprising
an orientation layer disposed as a base of the second alloy layer to orient a lamination plane of the second alloy layer laminated thereon along a (111) plane.

6. The method for recording information according to claim 5, wherein the orientation layer has a composition and a crystal structure identical to those of the first alloy layer.

7. The method for recording information according to claim 1, further comprising
a magnetic section configured to form a magnetic field in a direction perpendicular to a plane of the spin injection layer to inject a spin into the recording layer through the spin injection layer.

8. A method for reproducing information using a spin electronic memory, the method comprising measuring a status value of one of a resistance value and an optical reflectance of n recording layers laminated, and determining, based on the status value, number of the recording layers having information recorded thereon in the recording layers laminated, where n is an integer of at least 1 or more,
wherein the spin electronic memory comprises:
a pair of electrodes;
a recording layer disposed between the electrodes, the recording layer being formed by laminating a first alloy layer and a second alloy layer, the first alloy layer being formed to contain any one of SbTe, $Sb_2Te_3$, BiTe, $Bi_2Te_3$, BiSe, and $Bi_2Se_3$ as a principal component and to have a thickness of 2 nm to 10 nm, the second alloy layer being formed to contain an alloy expressed by a following general formula (1) as a principal component; and
a spin injection layer formed with a magnetic material and configured to inject a spin into the recording layer with the magnetic material being magnetized, $$M_{1-x}Te_x \quad (1)$$

where M represents an atom selected from atoms of Ge, Al, and Si, and x represents a value of 0.5 or more and less than 1.

9. The method for reproducing information according to claim 8, wherein
the first alloy layer has a hexagonal crystal structure, and the second alloy layer has a cubic crystal structure, and
a c-axis of the first alloy layer is oriented in a laminating direction, and a (111) plane of the second alloy layer is oriented along an adjacent surface adjacent to the first alloy layer.

10. The method for reproducing information according to claim 8, wherein
the second alloy layer is formed to contain GeTe as a principal component.

11. The method for reproducing information according to claim 8, wherein
the second alloy layer has a thickness of more than 0 and 4 nm or less.

12. The method for reproducing information according to claim 8, further comprising
an orientation layer disposed as a base of the second alloy layer to orient a lamination plane of the second alloy layer laminated thereon along a (111) plane.

13. The method for reproducing information according to claim 12, wherein
the orientation layer has a composition and a crystal structure identical to those of the first alloy layer.

14. The method for reproducing information according to claim 8, further comprising
a magnetic section configured to form a magnetic field in a direction perpendicular to a plane of the spin injection layer to inject a spin into the recording layer through the spin injection layer.

* * * * *